(12) United States Patent
Liu et al.

(10) Patent No.: US 7,936,588 B2
(45) Date of Patent: May 3, 2011

(54) MEMORY ARRAY WITH READ REFERENCE VOLTAGE CELLS

(75) Inventors: Hongyue Liu, Maple Grove, MN (US); Yong Lu, Rosemount, MN (US); Andrew Carter, Minneapolis, MN (US); Yiran Chen, Eden Prairie, MN (US); Hai Li, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/789,691

(22) Filed: May 28, 2010

(65) Prior Publication Data

US 2010/0232211 A1    Sep. 16, 2010

Related U.S. Application Data

(62) Division of application No. 12/212,798, filed on Sep. 18, 2008, now Pat. No. 7,755,923.

(51) Int. Cl.
*G11C 11/00* (2006.01)
(52) U.S. Cl. ............... 365/148; 365/189.04; 365/210.15; 365/100; 365/46
(58) Field of Classification Search .............. 365/148, 365/189.04, 210.15, 100, 46
See application file for complete search history.

(56) References Cited

U.S. PATENT DOCUMENTS

| | | | |
|---|---|---|---|
| 7,187,577 B1 | 3/2007 | Wang | |
| 7,224,601 B2 | 5/2007 | Panchula | |
| 7,233,537 B2 | 6/2007 | Tanizaki | |
| 7,272,034 B1 | 9/2007 | Chen | |
| 7,272,035 B1 | 9/2007 | Chen | |
| 7,286,395 B2 | 10/2007 | Chen | |
| 7,289,356 B2 | 10/2007 | Diao | |
| 7,345,912 B2 | 3/2008 | Luo | |
| 7,362,604 B2* | 4/2008 | Scheuerlein | ......... 365/148 |
| 7,379,327 B2 | 5/2008 | Chen | |
| 7,502,249 B1 | 3/2009 | Ding | |
| 7,515,457 B2 | 4/2009 | Chen | |
| 2002/0154531 A1 | 10/2002 | Lowrey | |
| 2007/0007536 A1 | 1/2007 | Hidaka | |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |

* cited by examiner

*Primary Examiner* — Thong Q Le
(74) *Attorney, Agent, or Firm* — Campbell Nelson Whipps LLC (57) ABSTRACT

The present disclosure relates to memory arrays with read reference voltage cells. In particular the present disclosure relates to variable resistive memory cell apparatus and arrays that include a high resistance state reference memory cell and a low resistance state reference memory cell that provides a reliable average reference voltage on chip to compare to a read voltage of a selected memory cell and determine if the selected memory cell is in the high resistance state or low resistance state. These memory arrays are particularly suitable for use with spin-transfer torque memory cells and resolves many systematic issues related to generation of a reliable reference voltage.

20 Claims, 5 Drawing Sheets

MEMORY ARRAY WITH READ REFERENCE VOLTAGE CELLS

CROSS-REFERENCE

This application is a divisional of application Ser. No. 12/212,798, filed Sep. 18, 2008, the contents of each is hereby incorporated by reference in its entirety.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern is that it can be difficult to reliably read the STRAM from cycle to cycle and from bit to bit. One read technique to sense the state of an STRAM bit is to inject a small current through the bit and measure the voltage at the end of a bit line, then compare it with a reference voltage, $V_{ref}$. Ideally, one would like to have $V_{ref}$ situated at a voltage value midpoint between the $V_{high}$ and $V_{low}$ distributions. Thus, there is a need to create a reliable $V_{ref}$, which stays in the middle between $V_{high}$ and $V_{low}$, independent of the sense current and the bit line length and loading, and is also insensitive to the timing of a sense amplifier enabling sequence.

BRIEF SUMMARY

The present disclosure relates to memory arrays with read reference voltage cells. In particular the present disclosure relates to variable resistive memory cell apparatus and arrays that include a high resistance state reference memory cell and a low resistance state reference memory cell that provides a reliable average reference voltage on chip to compare to a read voltage of a selected memory cell and determine if the selected memory cell is in the high resistance state or low resistance state. These memory arrays are particularly suitable for use with spin-transfer torque memory cells and resolves many systematic issues related to generation of a reliable reference voltage.

In an illustrative embodiment, a memory apparatus includes a variable resistive memory cell electrically between a read bit line and a read source line, the variable resistive memory cell is configured to switch between a high resistance state and a low resistance state. A read transistor is electrically between the read bit line and the read source line, and the read transistor electrically coupled to a word line. A low resistance state reference variable resistive memory cell and low resistance state reference transistor is electrically between a low resistance state reference bit line and a low resistance state reference source line, and the low resistance state reference transistor is electrically coupled to the word line. A high resistance state reference variable resistive memory cell and a high resistance state reference transistor is electrically between a high resistance state reference bit line and a high resistance state reference source line, and the high resistance state reference transistor electrically coupled to the word line. The low resistance state reference variable resistive memory cell and the high resistance state reference variable resistive memory cell provide an average voltage reference value when a read current is applied through the low resistance state reference variable resistive memory cell and the high resistance state reference variable resistive memory cell.

An illustrative method of reading a memory array apparatus, including the steps of passing a read current through a variable resistive memory cell to provide a read voltage and passing the read current through a low resistance state reference variable resistive memory cell and a high resistance state reference variable resistive memory cell in a same row line or column line as the selected variable resistive memory cell, at substantially the same time as the passing a read current through a variable resistive memory cell step, to provide an average voltage reference value. Then the method includes comparing the read voltage with the average voltage reference value to determine the resistance state of the selected variable resistive memory cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

The present disclosure relates to memory arrays with read reference voltage cells. In particular the present disclosure relates to variable resistive memory cell apparatus and arrays that include a high resistance state reference memory cell and a low resistance state reference memory cell that provides a reliable average reference voltage on chip to compare to a read voltage of a selected memory cell and determine if the selected memory cell is in the high resistance state or low resistance state. These memory arrays are particularly suitable for use with spin-transfer torque memory cells and resolves many systematic issues related to generation of a reliable reference voltage. Since the reference voltage stays in the middle of the high and low resistance state voltages, the disclosed memory array is insensitive to the sense current and the bit line length and loading and is also insensitive to the timing of the sense amplifier sequence. While the present disclosure is not so limited, an appreciation of various aspects of the disclosure will be gained through a discussion of the examples provided below.

Figure 1:
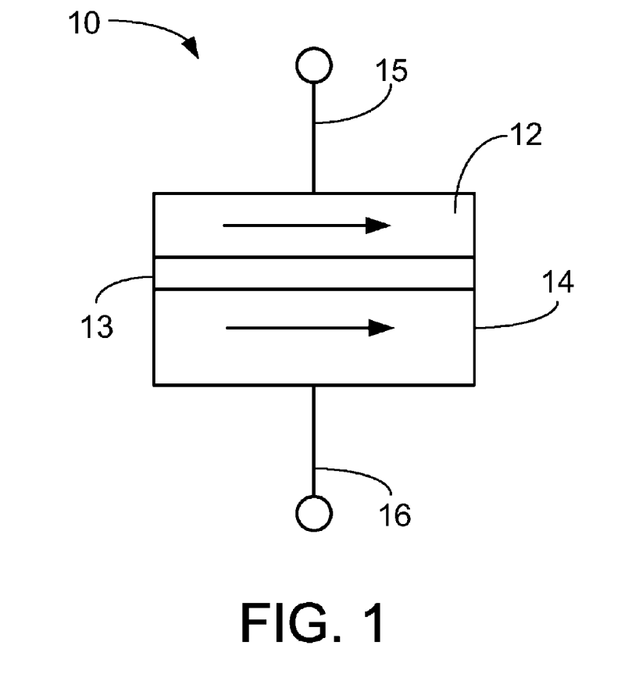
FIG. 1 is a cross-sectional schematic diagram of an illustrative variable resistive memory cell in the low resistance state.
Figure 2:
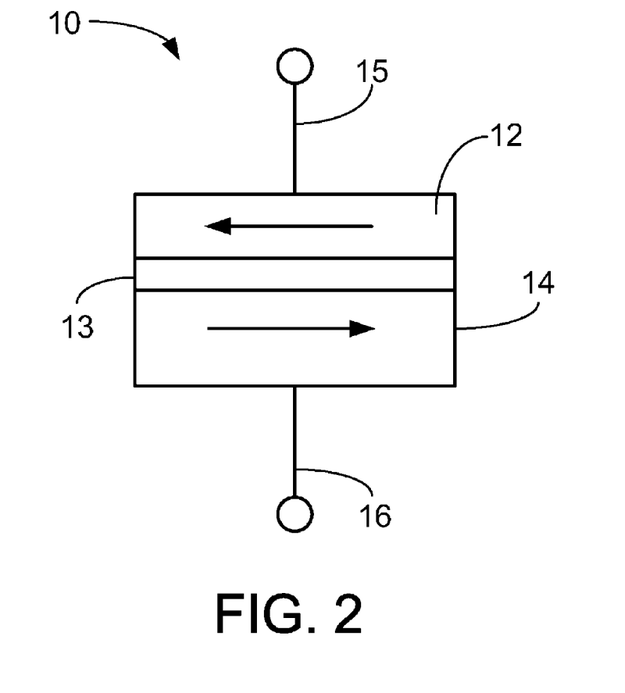
FIG. 2 is a cross-sectional schematic diagram of the illustrative variable resistive memory cell in the high resistance state.

FIG. 1 is a cross-sectional schematic diagram of an illustrative variable resistive memory cell 10 in the low resistance state and FIG. 2 is a cross-sectional schematic diagram of the illustrative variable resistive memory cell 10 in the high resistance state. The variable resistive memory cell can be any useful memory cell that can switch between a high resistance state and a low resistance state. In many embodiments, the variable resistive memory cell described herein is a spin-transfer torque memory cell.

The variable resistive memory cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the variable resistive memory cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the variable resistive memory cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the variable resistive memory cell 10 via spin-transfer occurs when a current, passing through a magnetic layer of the variable resistive memory cell 10, becomes spin polarized and imparts a spin torque on the free layer 12 of the variable resistive memory cell 10. When a sufficient spin torque is applied to the free layer 12, the magnetization orientation of the free layer 12 can be switched between two opposite directions and accordingly the variable resistive memory cell 10 can be switched between the parallel state (i.e., low resistance state or "0" data state) and anti-parallel state (i.e., high resistance state or "1" data state) depending on the direction of the current.

The illustrative spin-transfer torque variable resistive memory data cell 10 may be used to construct a memory device that includes multiple variable resistive memory cells where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque variable resistive memory data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
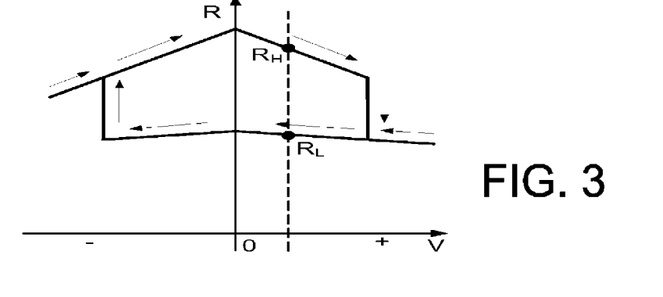
FIG. 3 is a graph of a static R-V sweep curve of a variable resistive memory data cell.

FIG. 3 is a graph of a static R-V sweep curve of a variable resistive memory data cell. When applying a positive voltage on the second electrode 16 in FIG. 1 or 2, the variable resistive memory data cell 10 enters the positive applied voltage region in FIG. 3 and switches from the high resistance state (FIG. 2) to the low resistance state (FIG. 1). When applying a positive voltage on the first electrode 15 in FIG. 1 or 2, the variable resistive memory data cell 10 enters the negative applied voltage region in FIG. 3. The resistance of the variable resistive memory data cell switches from the low resistance state (FIG. 1) to the high resistance state (FIG. 2).

Let $R_H$ and $R_L$ denote the high and low magnet resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the variable resistive memory data cell.

Figure 4:
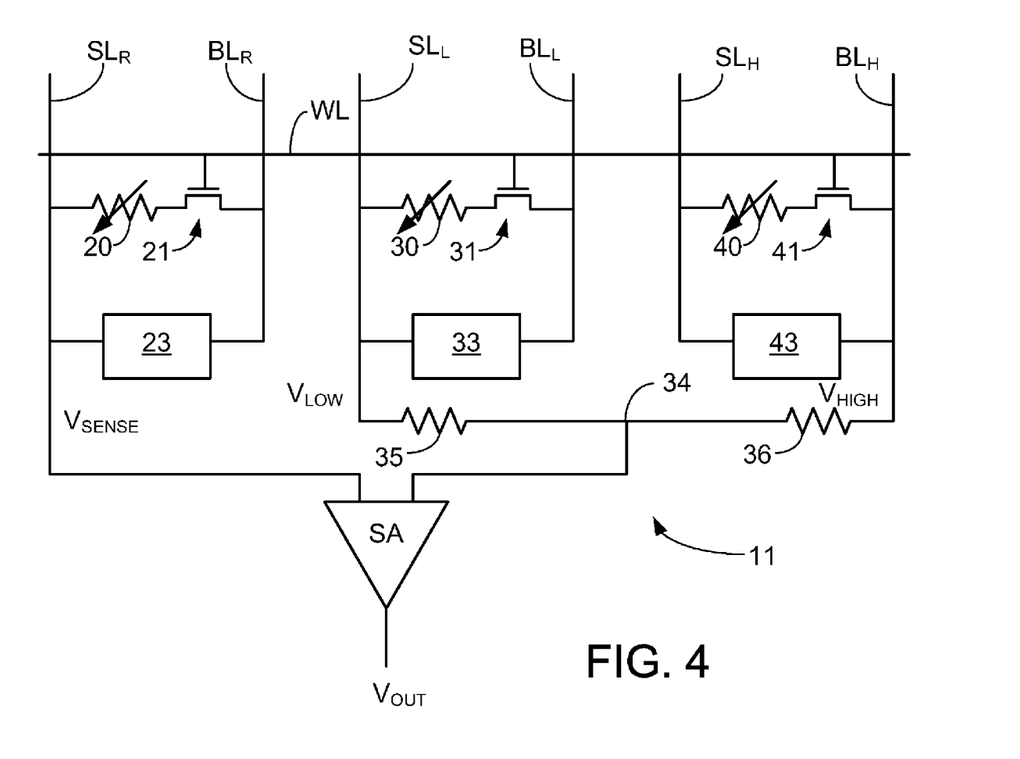
FIG. 4 is schematic circuit diagram of a memory apparatus.

FIG. 4 is schematic circuit diagrams of a memory apparatus 11. The memory apparatus 11 includes a variable resistive memory cell 20 electrically between a read bit line $BL_R$ and a read source line $SL_R$. The variable resistive memory cell 20 is configured to switch between a high resistance state and a low resistance state, as described above. In many embodiments, the read transistor 21 is electrically between the read bit line $BL_R$ and the variable resistive memory cell 20. In other embodiments (not shown), the read transistor 21 is electrically between the read source line $SL_R$ the variable resistive memory cell 20. The read transistor 21 is electrically coupled to a word line WL via a gate contact of the read transistor 21. The read transistor 21 can be any useful transistor such as, for example, a NMOS or PMOS semiconductor device. A read driver 23 is electrically coupled to the read bit line $BL_R$ and the read source line $SL_R$ to sense the voltage $V_{SENSE}$ (in response to an applied read current) across the variable resistive memory cell circuitry. The read driver 23 is electrically coupled to a sense amplifier SA and provides the voltage $V_{SENSE}$ to the sense amplifier SA for comparison with the average reference voltage $V_{REF}$.

A low resistance state reference variable resistive memory cell 30 is electrically between a low resistance state reference bit line $BL_L$ and a low resistance state reference source line $SL_L$. In many embodiments, a low resistance state reference transistor 31 is electrically between the low resistance state reference bit line $BL_L$ and the low resistance state reference variable resistive memory cell 30. In other embodiments (not shown), the read transistor 31 is electrically between the low resistance state reference source line $SL_L$ and the low resistance state reference variable resistive memory cell 31. The low resistance state reference transistor 31 is electrically coupled to the word line WL. The low resistance state reference transistor 31 can be any useful transistor such as, for example, a NMOS or PMOS semiconductor device. A low resistance state reference read driver 33 is electrically coupled to the low resistance state reference bit line $BL_L$ and the low resistance state reference source line $SL_L$ to sense the voltage $V_{LOW}$ (in response to an applied read current) across the low resistance state reference variable resistive memory cell circuitry.

A high resistance state reference variable resistive memory cell 40 is electrically between a high resistance state reference bit line $BL_H$ and a high resistance state reference source line $SL_H$. In many embodiments, a high resistance state reference transistor 41 is electrically between the high resistance state reference bit line $BL_H$ and the high resistance state reference variable resistive memory cell 40. In other embodiments (not shown), the read transistor 41 is electrically between the high resistance state reference source line $SL_H$ and the high resistance state reference variable resistive memory cell 41. The high resistance state reference transistor 41 is electrically coupled to the word line WL. The high resistance state reference transistor 41 can be any useful transistor such as, for example, a NMOS or PMOS semiconductor device. A high resistance state reference read driver 43 is electrically coupled to the high resistance state reference bit line $BL_H$ and the high resistance state reference source line $SL_H$ to sense the voltage $V_{HIGH}$ (in response to an applied read current) across the high resistance state reference variable resistive memory cell circuitry.

The low resistance state reference read driver 33 and the high resistance state reference read driver 43 are electrically connected to a node 34 and provides the average reference voltage $V_{REF}$ to the sense amplifier SA for comparison with the voltage $V_{SENSE}$. The average reference voltage $V_{REF}$ is equal to $(V_{LOW}+V_{HIGH})/2$ and it is the midpoint voltage value between $V_{LOW}$ and $V_{HIGH}$. The sense amplifier SA provides an output voltage $V_{OUT}$ to indicate whether the variable resistive memory cell 20 is in a high resistance state or a low resistance state.

Figure 5:
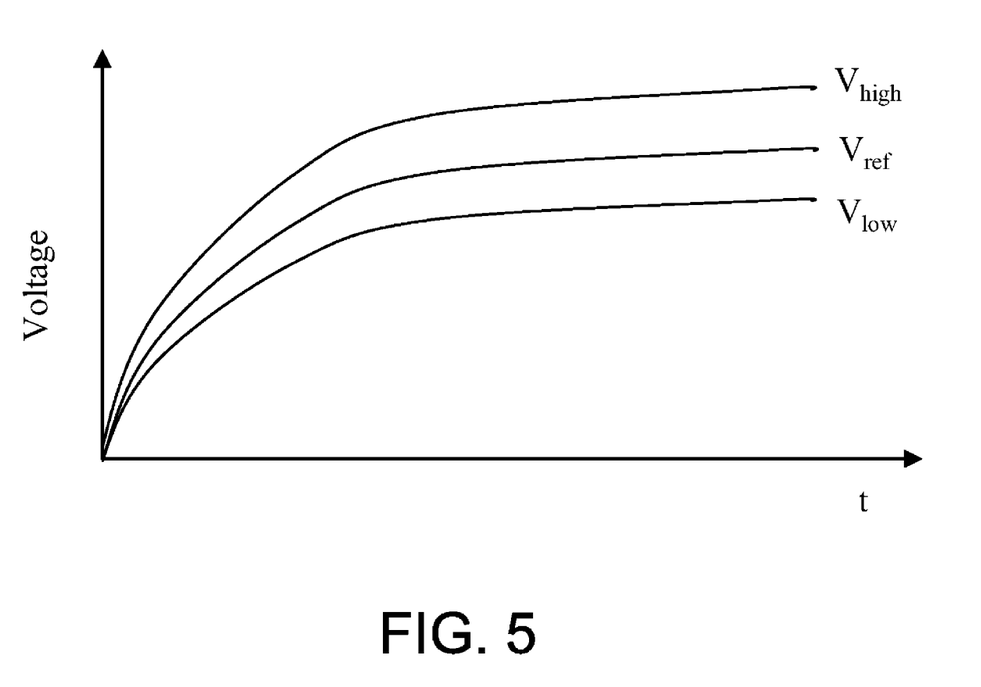
FIG. 5 is a graph of the voltage response across the high and low resistance state reference memory cells and the corresponding reference voltage obtained as a function of time.

As illustrated, all three variable resistive memory cells 20, 30, 40 share a common word line WL. The read circuitry for all three variable resistive memory cells 20, 30, 40 is as close a copy of each other as possible in order to clone the transient behavior of all three voltages $V_{SENSE}$, $V_{LOW}$ and $V_{HIGH}$. In many embodiments, identical current drivers (not shown) between the two reference cells 30 and 40 and the data cell 20 inject currents through the two reference cells 30 and 40 and the data cell 20. In many embodiments, two resistors 35, 36 or capacitors of the same size are tied together at the end of the two reference cell bit lines $BL_L$ and $BL_H$ or source lines $SL_L$ and $SL_H$. The reference voltage $V_{REF}$ is generated by wiring the voltage out from the node 34 between the two resistors 35, 36. To the first order, $V_{REF}$ is equal to $(V_{LOW}+V_{HIGH})/2$. It is noted that $V_{REF}$ is not a constant after the read current driver is turned on due to RC delay. However, since the loading on the two reference cells 30 and 40 circuitry are very similar to the data cell 20 circuitry being accessed, and the same current drivers are used for the two reference cells 30 and 40 as well as the data cell 20, $V_{REF}$, $V_{LOW}$ and $V_{HIGH}$ track each other in the time domain, as illustrated in FIG. 5.

In many embodiments, the data cell 20 and the reference cells 30, 40 have sustainably the same structure and are formed on-chip at substantially the same time. This eliminates several of the process, voltage and operation variables that can plague memory structures that are not formed on-chip.

Figure 6:
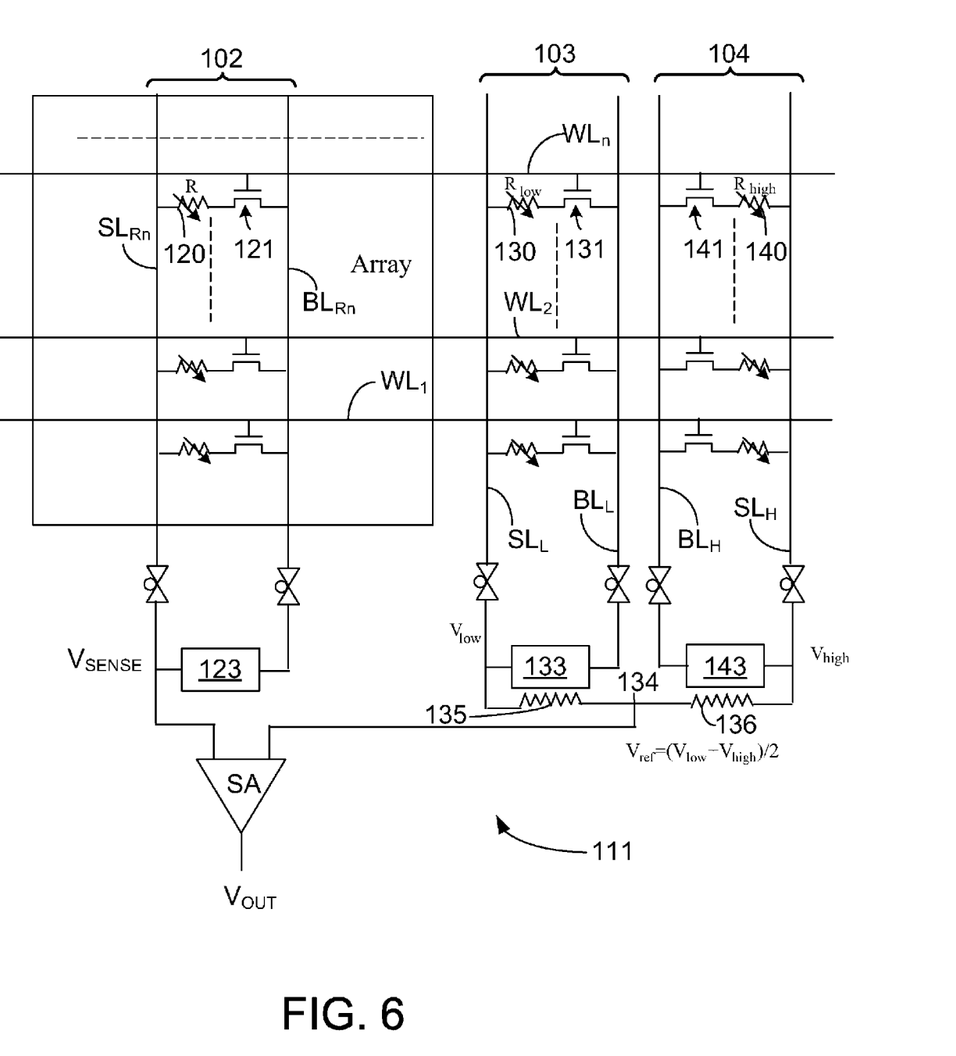
FIG. 6 is a schematic circuit diagram of a memory array apparatus.

FIG. 6 is a schematic circuit diagram of a memory array apparatus 111. The memory array apparatus 111 includes a plurality of variable resistive memory cell column lines 102 arranged in an array. Each memory cell column line 102 including a plurality of variable resistive memory cells 120. Each variable resistive memory cells 120 is electrically between a read bit line $BL_{Rn}$ and a read source line $SL_{Rn}$. Each variable resistive memory cell 120 is configured to switch between a high resistance state and a low resistance state, as described above. In many embodiments, a read transistor 121 is electrically between the read bit line $BL_{Rn}$ and the variable resistive memory cell 120. In other embodiments (not shown), the read transistor 121 is electrically between the read source line $SL_{Rn}$, the variable resistive memory cell 120. The read transistor 121 is electrically coupled to a word line $WL_n$ via a gate contact of the read transistor 121. The read transistor 121 can be any useful transistor, as described above. A read driver 123 is electrically coupled to the read bit line $BL_{Rn}$ and the read source line $SL_{Rn}$ to sense the voltage $V_{SENSE}$ (in response to an applied read current) across the variable resistive memory cell circuitry. The read driver 123 is electrically coupled to a sense amplifier SA and provides the voltage $V_{SENSE}$ to the sense amplifier SA for comparison with the average reference voltage $V_{REF}$. As illustrated, the word lines $WL_1$, $WL_2$, and $WL_n$ are parallel to each other and orthogaonal to the source lines $SL_{Rn}$, $SL_L$, and $SL_H$ and the bit lines $BL_{Rn}$, $BL_L$, and $BL_H$. The word lines $WL_1$, $WL_2$, and $WL_n$ form row lines and connect each transistor in the row line.

A low resistance state reference variable resistive memory cell column line 103 includes a plurality of low resistance state reference variable resistive memory cells 130. Each low resistance state reference variable resistive memory cell 130 is electrically between a low resistance state reference bit line $BL_L$ and a low resistance state reference source line $SL_L$. In many embodiments, a low resistance state reference transistor 131 is electrically between the low resistance state reference bit line $BL_L$ and the low resistance state reference variable resistive memory cell 130. In other embodiments (not shown), the read transistor 131 is electrically between the low resistance state reference source line $SL_L$ and the low resistance state reference variable resistive memory cell 131. The low resistance state reference transistor 131 is electrically coupled to the word line $WL_n$. The low resistance state reference transistor 131 can be any useful transistor, as described above. A low resistance state reference read driver 133 is electrically coupled to the low resistance state reference bit line $BL_L$ and the low resistance state reference source line $SL_L$ to sense the voltage $V_{LOW}$ (in response to an applied read current) across the low resistance state reference variable resistive memory cell circuitry.

A high resistance state reference variable resistive memory cell column line 104 includes a plurality of high resistance state reference variable resistive memory cells 140. Each high resistance state reference variable resistive memory cell 140 is electrically between a high resistance state reference bit line $BL_H$ and a high resistance state reference source line $SL_H$. In many embodiments, a high resistance state reference transistor 141 is electrically between the high resistance state reference bit line $BL_H$ and the high resistance state reference variable resistive memory cell 140. In other embodiments (not shown), the read transistor 141 is electrically between the high resistance state reference source line $SL_H$ and the high resistance state reference variable resistive memory cell 141. The high resistance state reference transistor 141 is electrically coupled to the word line $WL_n$. The high resistance state reference transistor 141 can be any useful transistor, as described above. A high resistance state reference read driver 143 is electrically coupled to the high resistance state reference bit line $BL_H$ and the high resistance state reference source line $SL_H$ to sense the voltage $V_{HIGH}$ (in response to an applied read current) across the high resistance state reference variable resistive memory cell circuitry.

The low resistance state reference read driver 133 and the high resistance state reference read driver 143 are electrically connected to a node 134 and provides the average reference voltage $V_{REF}$ to the sense amplifier SA for comparison with the voltage $V_{SENSE}$. The average reference voltage $V_{REF}$ is equal to $(V_{LOW}+V_{HIGH})/2$ and it is the midpoint voltage value between $V_{LOW}$ and $V_{HIGH}$. The sense amplifier SA provides an output voltage $V_{OUT}$ to indicate whether the variable resistive memory cell 120 is in a high resistance state or a low resistance state.

As illustrated, all three variable resistive memory cells 120, 130, 140 share a common word line $WL_n$. The read circuitry for all three variable resistive memory cells 120, 130, 140 is as close a copy of each other as possible in order to clone the transient behavior of all three voltages $V_{SENSE}$, $V_{LOW}$ and $V_{HIGH}$. In many embodiments, identical current drivers (not shown) between the two reference cells 130 and 140 and the data cell 120 inject currents through the two reference cells 130 and 140 and the data cell 120. In many embodiments, two resistors 135, 136 or capacitors of the same size are tied together at the end of the two reference cell bit lines $BL_L$ and $BL_H$ or source lines $SL_L$ and $SL_H$. The reference voltage $V_{REF}$ is generated by wiring the voltage out from the node 134 between the two resistors 135, 136. To the first order, $V_{REF}$ is equal to $(V_{LOW}+V_{HIGH})/2$. It is noted that $V_{REF}$ is not a constant after the read current driver is turned on due to RC delay. However, since the loading on the two reference cells 130 and 140 circuitry are very similar to the data cell 120 circuitry being accessed, and the same current drivers are used for the two reference cells 130 and 140 as well as the data cell 120, $V_{REF}$, $V_{LOW}$ and $V_{HIGH}$ track each other in the time domain, as illustrated in FIG. 5. In addition, this circuit structure provides one data cell and two reference cells in each row, thus the bit line and source line distances from the row to the read drivers is substantially equal, further improving the response as illustrated in FIG. 5.

In many embodiments, the data cell 120 and the reference cells 130, 140 have sustainably the same structure and are formed on-chip at substantially the same time. This eliminates several of the process, voltage and operation variables that can plague memory structures that are not formed on-chip. A significant feature of this circuit topology is that even if the sense amplifier is turned on before the sense current is stabilized, the sense circuit will still work properly because $V_{REF}$ is always stays between $V_{HIGH}$ and $V_{LOW}$.

Figure 7:
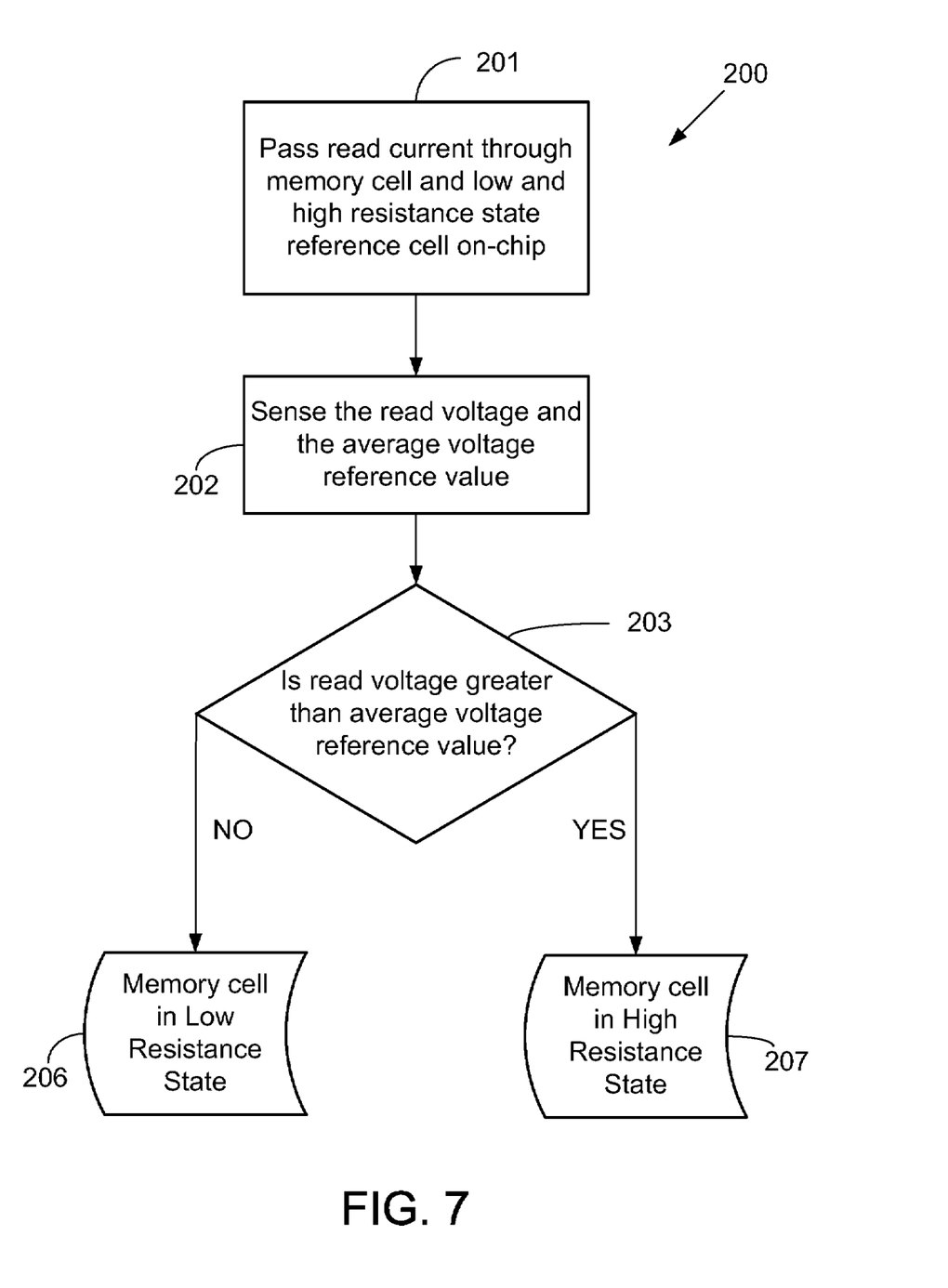
FIG. 7 is a flow diagram of an illustrative method of reading a memory array apparatus.

FIG. 7 is a flow diagram of an illustrative method of reading a memory array apparatus 200. The method includes the steps of passing a read current through a selected variable resistive memory cell within a plurality of selected variable resistive memory cell columns and passing the read current through a low resistance state reference variable resistive memory cell and a high resistance state reference variable resistive memory cell in a same row line as the selected variable resistive memory cell, at substantially the same time as the passing a read current through a variable resistive memory cell step, to provide an average voltage reference value at block 201. Then the read voltage and the average voltage reference value is sensed at block 202. The read voltage is then compared with the average voltage reference value to determine the resistance state of the selected variable resistive memory cell at block 203. If the read voltage is less than the average voltage reference value, then the memory cell is in the low resistance state at block 206. If the read voltage is greater than the average voltage reference value, then the memory cell is in the high resistance state at block 207.

Thus, embodiments of the MEMORY ARRAY WITH READ REFERENCE VOLTAGE CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory apparatus, comprising:
a variable resistive memory cell electrically between a read bit line and a read source line, the variable resistive memory cell is configured to switch between a high resistance state and a low resistance state, and a read transistor electrically in series with the variable resistive memory cell and the read transistor electrically coupled to a word line;
a low resistance state reference variable resistive memory cell electrically between a low resistance state reference bit line and a low resistance state reference source line, and a low resistance state reference transistor electrically in series with the low resistance state reference variable resistive memory cell and the low resistance state reference transistor electrically coupled to the word line;
a high resistance state reference variable resistive memory cell electrically between a high resistance state reference bit line and a high resistance state reference source line, and a high resistance state reference transistor electrically in series with the high resistance state reference variable resistive memory cell and the high resistance state reference transistor electrically coupled to the word line; and
wherein the low resistance state reference variable resistive memory cell and the high resistance state reference variable resistive memory cell provide an average voltage reference value when a read current is applied through the low resistance state reference variable resistive memory cell and the high resistance state reference variable resistive memory cell.

2. A memory apparatus according to claim 1, wherein the variable resistive memory cell is a spin-transfer torque memory cell and the low resistance state reference variable resistive memory cell is a spin-transfer torque memory cell and the high resistance state reference variable resistive memory cell is a spin-transfer torque memory cell.

3. A memory apparatus according to claim 2, wherein the variable resistive memory cell, the low resistance state reference variable resistive memory cell, and the high resistance state reference variable resistive memory cell have substantially the same structure.

4. A memory apparatus according to claim 1, wherein the low resistance state reference variable resistive memory cell and the high resistance state reference variable resistive memory cell are electrically connected to a reference read driver and the variable resistive memory cell is electrically connected to a read driver having substantially identical read circuitry and the reference read driver and the read driver provides an output to a sense amplifier.

5. A memory apparatus according to claim 1, wherein the variable resistive memory cell, the low resistance state reference variable resistive memory cell, and the high resistance state reference variable resistive memory cell are electrically connected to a read current driver that provides read current to the variable resistive memory cell, the low resistance state reference variable resistive memory cell and the high resistance state reference variable resistive memory cell at substantially the same time.

6. A memory apparatus according to claim 1, wherein the variable resistive memory cell circuitry, the low resistance state reference variable resistive memory cell circuitry, and the high resistance state reference variable resistive memory cell circuitry provide substantially the same resistance value to a specified read current passing through each of the variable resistive memory cell circuitry, the low resistance state reference variable resistive memory cell circuitry, and the high resistance state reference variable resistive memory cell.

7. A memory apparatus according to claim 1, wherein the average voltage reference value is a midpoint voltage value between the low resistance state reference value and the high resistance state reference.

8. A memory apparatus according to claim 1, wherein the variable resistive memory cell, the low resistance state reference variable resistive memory cell, and the high resistance state reference variable resistive memory cell are disposed on a memory chip.

9. A memory array apparatus, comprising:
a plurality of variable resistive memory cell column lines arranged in an array, each column line comprising a plurality of variable resistive memory cells, each variable resistive memory cell is electrically between a read bit line and a read source line, at least selected variable resistive memory cells are configured to switch between a high resistance state and a low resistance state, a read transistor is in series with the variable resistive memory cell and electrically between the read bit line and the read source line, the read transistor is electrically coupled to a word line, the word line electrically connecting each read transistor in a row line;
a low resistance state reference variable resistive memory cell column line comprising a plurality of low resistance state reference variable resistive memory cells, each low resistance state reference variable resistive memory cell is electrically between a low resistance state reference bit line and a low resistance state reference source line, a low resistance state reference transistor is in series with the low resistance state reference variable resistive memory cell and electrically between the low resistance state reference bit line and the low resistance state reference source line, the low resistance state reference transistor is electrically coupled to the word line, the word line electrically connecting the low resistance state reference transistor to each read transistor in the row line;
a high resistance state reference variable resistive memory cell column line comprising a plurality of high resistance state reference variable resistive memory cells, each high resistance state reference variable resistive memory cell is electrically between a high resistance state reference bit line and a high resistance state reference source line, a high resistance state reference transistor is in series with the high resistance state reference variable resistive memory cell and electrically between the high resistance state reference bit line and the high resistance state reference source line, the high resistance state reference transistor is electrically coupled to the word line, the word line electrically connecting the high resistance state reference transistor to each read transistor in the row line;
wherein the low resistance state reference variable resistive memory cell and the high resistance state reference variable resistive memory cell provide an average voltage reference value when a read current is applied through the low resistance state reference variable resistive memory cell and the high resistance state reference variable resistive memory cell.

10. A memory array apparatus according to claim 9, wherein at least selected variable resistive memory cells are spin-transfer torque memory cells and at least selected low resistance state reference variable resistive memory cells are spin-transfer torque memory cells and at least selected high resistance state reference variable resistive memory cells are spin-transfer torque memory cells.

11. A memory array apparatus according to claim 9, wherein the variable resistive memory cell column lines, the low resistance state reference variable resistive memory cell column line, and the high resistance state reference variable resistive memory cell column line have an equal number of row lines.

12. A memory array apparatus according to claim 9, wherein the variable resistive memory cell column line read bit line and read source line are electrically connected to a read driver and the low resistance state reference variable resistive memory cell column line low resistance state reference bit line and low resistance state reference source line and the high resistance state reference variable resistive memory cell column line high resistance state reference bit line and high resistance state reference source line are electrically connected to a reference read driver having substantially identical read circuitry with the read driver, and the read driver and the reference read driver provides an output to a sense amplifier.

13. A memory array apparatus according to claim 9, wherein each row variable resistive memory cell circuitry, low resistance state reference variable resistive memory cell circuitry, and high resistance state reference variable resistive memory cell circuitry provide substantially the same resistance value to a specified read current passing through each of the row variable resistive memory cell circuitry, low resistance state reference variable resistive memory cell circuitry, and high resistance state reference variable resistive memory cell.

14. A memory array apparatus according to claim 9, wherein the average voltage reference value is a midpoint voltage value between the low resistance state reference value and the high resistance state reference.

15. A memory array apparatus according to claim 9, wherein the variable resistive memory cell column lines, the low resistance state reference variable resistive memory cell column line, and the high resistance state reference variable resistive memory cell column line are disposed on a memory chip.

16. A memory array apparatus according to claim 9, wherein the variable resistive memory cell column lines, the low resistance state reference variable resistive memory cell column line, and the high resistance state reference variable resistive memory cell column line are electrically connected to a read current driver that provides read current to the variable resistive memory cell, the low resistance state reference variable resistive memory cell and the high resistance state reference variable resistive memory cell in a row line at substantially the same time.

17. A method of reading a memory apparatus, comprising the steps of:
    passing a read current through a variable resistive memory cell, the variable resistive memory cell is configured to switch between a high resistance state and a low resistance state, to provide a read voltage;
    passing the read current through a low resistance state reference variable resistive memory cell and a high resistance state reference variable resistive memory cell in a same row line or column line as the variable resistive memory cell, at substantially the same time as the passing a read current through a variable resistive memory cell step, to provide an average voltage reference value;
    comparing the read voltage with the average voltage reference value to determine the resistance state of the selected variable resistive memory cell.

18. A method according to claim 17, wherein the variable resistive memory cell is a spin-transfer torque memory cell and the low resistance state reference variable resistive memory cell is a spin-transfer torque memory cell and the high resistance state reference variable resistive memory cell is a spin-transfer torque memory cell.

19. A method according to claim 17, wherein the passing a read current through a selected variable resistive memory cell step and the passing the read current through a low resistance state reference variable resistive memory cell and a high resistance state reference variable resistive memory cell step comprises applying a current through a word line to allow current to flow though an read transistor, a low resistance state reference transistor, and a high resistance state reference transistor at the same time.

20. A method according to claim 17, wherein the passing the read current through a low resistance state reference variable resistive memory cell and a high resistance state reference variable resistive memory cell step provides a midpoint voltage value between the low resistance state reference value and the high resistance state reference at all currents values up to the read current value passing though the low resistance state reference variable resistive memory cell and a high resistance state reference variable resistive memory cell.

* * * * *